(12) United States Patent
Chong et al.

(10) Patent No.: US 7,718,500 B2
(45) Date of Patent: May 18, 2010

(54) FORMATION OF RAISED SOURCE/DRAIN STRUCTURES IN NFET WITH EMBEDDED SIGE IN PFET

(75) Inventors: Yung Fu Chong, Singapore (SG); Zhijiong Luo, Carmel, NY (US); Joo Chan Kim, Fishkill, NY (US); Judson Robert Holt, Wappingers Falls, NY (US)

(73) Assignees: Chartered Semiconductor Manufacturing, Ltd, Singapore (SG); International Business Machines Corporation (IBM), Armonk, NY (US); Samsung Electronics Co., Ltd., Suwon-si, Gyeonggi-do (KR)

( * ) Notice: Subject to any disclaimer, the term of this patent is extended or adjusted under 35 U.S.C. 154(b) by 864 days.

(21) Appl. No.: 11/305,584

(22) Filed: Dec. 16, 2005

(65) Prior Publication Data

US 2007/0138570 A1 Jun. 21, 2007

(51) Int. Cl.
*H01L 21/336* (2006.01)
(52) U.S. Cl. ............... 438/300; 438/233; 438/509; 257/E21.43; 257/E21.431; 257/E21.631
(58) Field of Classification Search ........... 438/300, 438/233, 509; 257/E21.43, E21.431, E21.634
See application file for complete search history.

(56) References Cited

U.S. PATENT DOCUMENTS 5,824,586 A * 10/1998 Wollesen et al. ............ 438/300

| | | | |
|---|---|---|---|
| 6,159,815 A | 12/2000 | Lustig et al. | |
| 6,531,347 B1 | 3/2003 | Huster | |
| 6,849,883 B2 | 2/2005 | Okihara | |
| 6,861,318 B2 | 3/2005 | Murthy | |

(Continued)

FOREIGN PATENT DOCUMENTS

JP 2001-284468 10/2001

(Continued)

OTHER PUBLICATIONS

Gene Fitzgerald, "A quick primer on strained silicon", URL: http://www.eetimes.com/showArticle.jhtml?articleID=18100036 (Feb. 23, 2004 12:00 PM EST).

*Primary Examiner*—Matthew Smith
*Assistant Examiner*—Julio J Maldonado
(74) *Attorney, Agent, or Firm*—Horizon IP Pte Ltd

(57) ABSTRACT

A structure and method for forming raised source/drain structures in a NFET device and embedded SiGe source/drains in a PFET device. We provide a NFET gate structure over a NFET region in a substrate and PFET gate structure over a PFET region. We provide NFET SDE regions adjacent to the NFET gate and provide PFET SDE regions adjacent to the PFET gate. We form recesses in the PFET region in the substrate adjacent to the PFET second spacers. We form a PFET embedded source/drain stressor in the recesses. We form a NFET S/D epitaxial Si layer over the NFET SDE regions and a PFET S/D epitaxial Si layer over PFET embedded source/drain stressor. The epitaxial Si layer over PFET embedded source/drain stressor is consumed in a subsequent salicide step to form a stable and low resistivity silicide over the PFET embedded source/drain stressor. We perform a NFET S/D implant by implanting N-type ions into NFET region adjacent to the NFET gate structure and into the NFET S/D stressor Si layer to form the raised NFET source/drains.

22 Claims, 7 Drawing Sheets

U.S. PATENT DOCUMENTS

| | | | |
|---|---|---|---|
| 6,881,635 B1 | 4/2005 | Chidambarrao | |
| 6,906,360 B2 | 6/2005 | Chen et al. | |
| 7,176,110 B2 * | 2/2007 | van Bentum et al. | 438/478 |
| 7,176,522 B2 * | 2/2007 | Cheng et al. | 257/338 |
| 7,348,248 B2 * | 3/2008 | Cheng | 438/301 |
| 7,354,835 B2 * | 4/2008 | Shin et al. | 438/300 |
| 2004/0262683 A1 * | 12/2004 | Bohr et al. | 257/338 |
| 2005/0035409 A1 | 2/2005 | Ko | |
| 2005/0079692 A1 | 4/2005 | Samoilov | |

FOREIGN PATENT DOCUMENTS

| | | |
|---|---|---|
| KR | 1020050121479 A | 12/2005 |

* cited by examiner

FORMATION OF RAISED SOURCE/DRAIN STRUCTURES IN NFET WITH EMBEDDED SIGE IN PFET

BACKGROUND OF INVENTION

1) Field of the Invention

This invention relates generally to devices and methods for the fabrication of semiconductor devices and more particularly to the fabrication of Field Effect Transistors (FETs) having embedded Source/Drain regions and FETs having raised S/D regions.

2) Description of the Prior Art

It is now well-established that raised source/drain (S/D) structures and embedded SiGe (eSiGe) are useful techniques to enhance device performance. However, both techniques involve complicated processes compared to a normal CMOS process flow. Especially for eSiGe, besides the additional process needed for Si recess and epitaxial growth in the PFET S/D region, the eSiGe scheme needs additional process to protect the poly-Si gate as well. It is also extremely difficult to integrate eSiGe in the PFET while having raised S/D structures in the NFET.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents.

US20050035409A1: Structure and method of a strained channel transistor and a second semiconductor component in an integrated circuit—Semiconductor chip for use in semiconductor integrated circuit, comprises semiconductor substrate having first and second active regions, resistor formed in first active region, and strained channel transistor formed in second active region. Inventor: Ko, Chih-Hsin; Kaohsiung, Taiwan US20050079692A1: Methods to fabricate MOSFET devices using selective deposition process—Fabrication of silicon-based device on substrate surface involves depositing first and second silicon-containing layers by exposing to specified first and second process gases, respectively Inventor: Samoilov, Arkadii V.; Sunn U.S. Pat. No. 6,881,635: Strained silicon NMOS devices with embedded source/drain—Formation of n-type field effect transistor involves removing silicon germanide material outside transistor body and below strained silicon layer and replacing the removed material with epitaxial silicon. Inventor: Chidambarrao, Dureseti U.S. Pat. No. 6,861,318: Semiconductor transistor having a stressed channel—Semiconductor transistor for integrated circuits, comprises source and drain formed in source and drain recesses, respectively, source and/or drain being made of film material, which is formed to have second lattice having second spacing Inventor: Murthy, Anand; The patent shows a process for recessed S/D SiGe regions.

U.S. Pat. No. 6,531,347: Method of making recessed source drains to reduce fringing capacitance—Manufacture of semiconductor device involves forming source and drain regions that are recessed at prescribed depth below semiconductor substrate surface Inventor: Huster, Carl U.S. Pat. No. 6,849,883: Strained SOI MOSFET device and method of fabricating same—MOSFET device as e.g. large-scale integration circuit comprises first MOSFET with silicon layer in first region serving as strained silicon channel and second MOSFET with silicon epitaxial layer serving as silicon channel—Inventor: Okihara, Masao; Tokyo, Japan Gene Fitzgerald, "A quick primer on strained silicon", URL: http://www.eetimes.com/showArticle.jhtml?articleID=18100036 (Feb. 23, 2004 12:00 PM EST) discusses boron doped SiGe epitaxy processes.

SUMMARY OF THE INVENTION

Some example embodiments of the present invention provide a structure and a method of manufacturing a FET device with raised Source/Drain structures and a second FET device with embedded SiGe source/drain regions.

A structure and method for forming raised source/Drain structures in NFET with embedded SiGe in PFET. We provide a NFET gate structure over a NFET region in a substrate and PFET gate structure over a PFET region. We provide NFET SDE regions adjacent to the NFET gate and provide PFET SDE regions adjacent to the PFET gate. We form recesses in the PFET region in the substrate adjacent to the PFET second spacers. We form a PFET embedded Source/drain stressor in the recesses. We form a NFET S/D epitaxial Si layer over the NFET SDE regions and a PFET S/D epitaxial Si layer over PFET embedded Source/drain stressor. We perform a NFET S/D implant by implanting N-type ions into NFET region adjacent to the NFET gate structure and into the NFET S/D epitaxial Si layer to form the raised NFET Source/drains.

In another aspect, silicide regions are formed and a stressor layer is formed over the structures. The epitaxial Si layer over the PFET embedded Source/drain stressor helps to form stable and low resistivity suicides over the PFET embedded Source/drain stressor.

In another aspect, reduced size spacers are formed on the gate structures and a stressor layer is formed over the structures.

Additional embodiments and aspects are shown in the claims as submitted and amended during prosecution.

The above and below advantages and features are of representative embodiments only, and are not exhaustive and/or exclusive. They are presented only to assist in understanding the invention. It should be understood that they are not representative of all the inventions defined by the claims, to be considered limitations on the invention as defined by the claims, or limitations on equivalents to the claims. For instance, some of these advantages may be mutually contradictory, in that they cannot be simultaneously present in a single embodiment. Similarly, some advantages are applicable to one aspect of the invention, and inapplicable to others. Furthermore, certain aspects of the claimed invention have not been discussed herein. However, no inference should be drawn regarding those discussed herein relative to those not discussed herein other than for purposes of space and reducing repetition. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference

DETAILED DESCRIPTION OF THE EXAMPLE EMBODIMENTS

The example embodiments of the present invention will be described in detail with reference to the accompanying drawings. The example embodiments provide a method of forming a PFET with embedded S/D stressor regions, and raised S/Ds in the NFET. In addition, a stress liner can be formed over reduced spacers of the FET gate.

Figure 1:
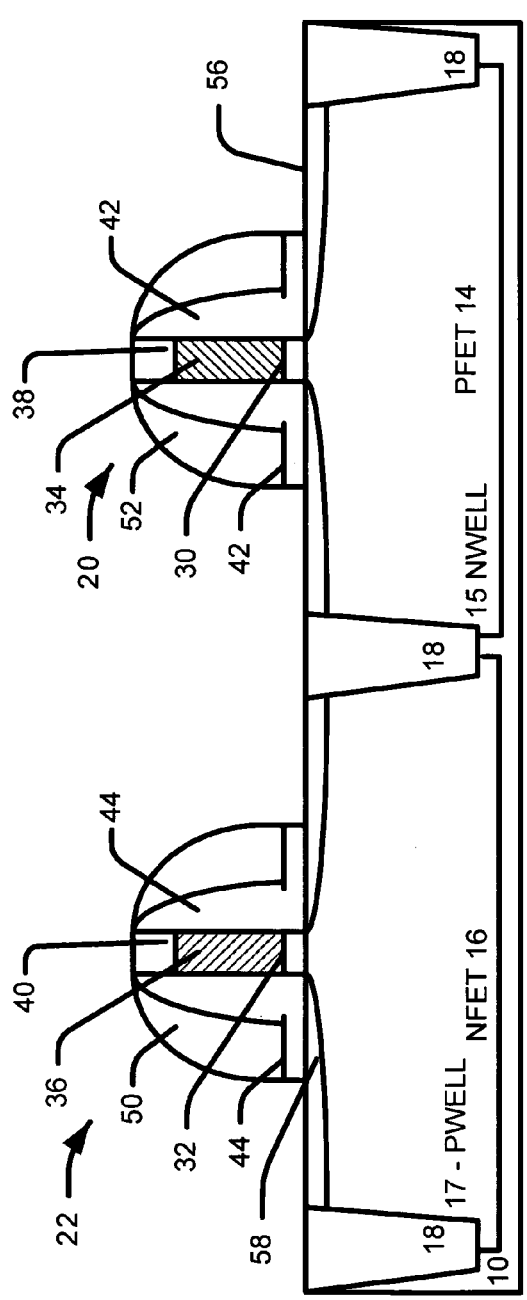
FIGS. 1 through 10 are cross sectional views for illustrating a structure and method for manufacturing a first FET with raised Source/Drain structures and a second FET with embedded SiGe in PFET according to an example embodiment of the present invention.

A. Provide a NFET Gate Structure over a NFET Region in a Substrate and PFET Gate Structure over a PFET Region Referring to FIG. 1, we provide a NFET gate structure 22 over a NFET region 16 in a substrate 10 and PFET gate structure 20 over a PFET region 14.

The NFET gate structure 22 is comprised of a NFET gate dielectric 32, a NFET gate 36, NFET gate cap layer 40 over the NFET gate 36, NFET first (L-shaped) spacers 44, and NFET second spacers 50. The gate cap layer 40 can be comprised of silicon nitride. The NFET second spacers 50 can be comprised of silicon nitride.

The PFET gate structure 20 is preferably comprised of a PFET gate dielectric 30, a PFET gate 34, PFET gate cap layer 38 comprised of silicon nitride, PFET first (L-shaped) spacers 42, and PFET second spacers 52. The PFET second spacers 52 can be comprised of silicon nitride.

We provide NFET Source/drain extension (SDE) or lightly doped drain (LDD) regions 58 adjacent to the NFET gate 36; and provide PFET LDD (or SDE) regions 56 adjacent to the PFET gate 34.

We provide isolation regions 18 between the PFET region 14 and the NFET region 16. The isolation regions are preferably STI regions comprised of silicon oxide.

The structure can have a Pwell 17 in the NFET region 16 and a Nwell 15 in the PFET region 14. PFET devices are formed in the PFET region. NFET devices are formed in the NFET region.

B. Form Recess for PFET S/D Stressor

Figure 2:
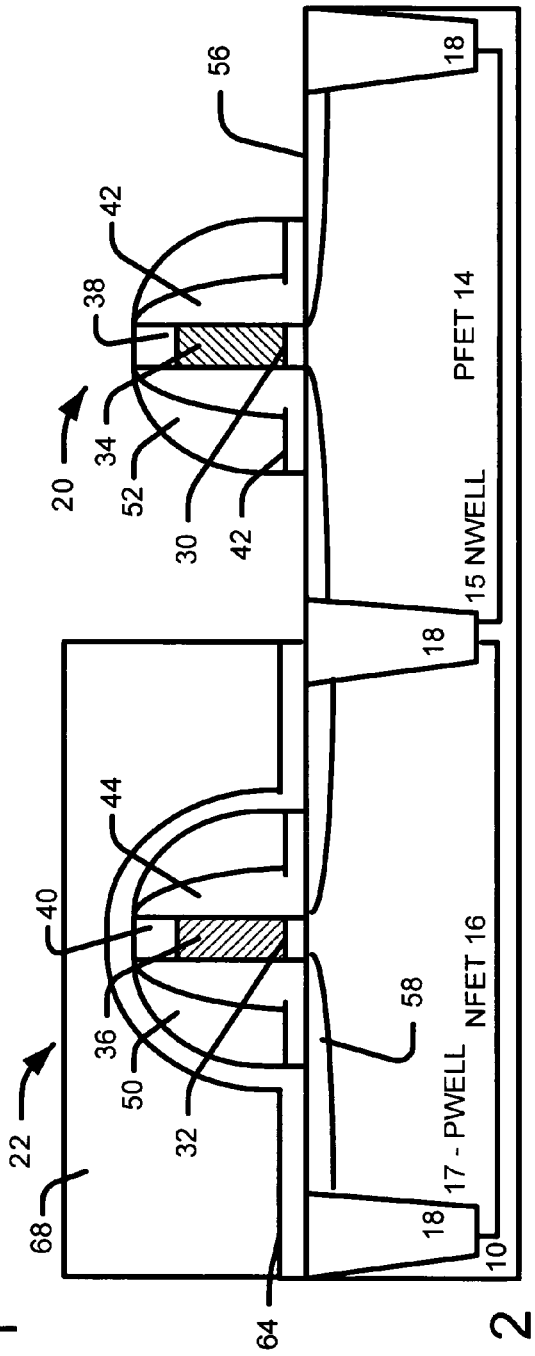
Figure 3:
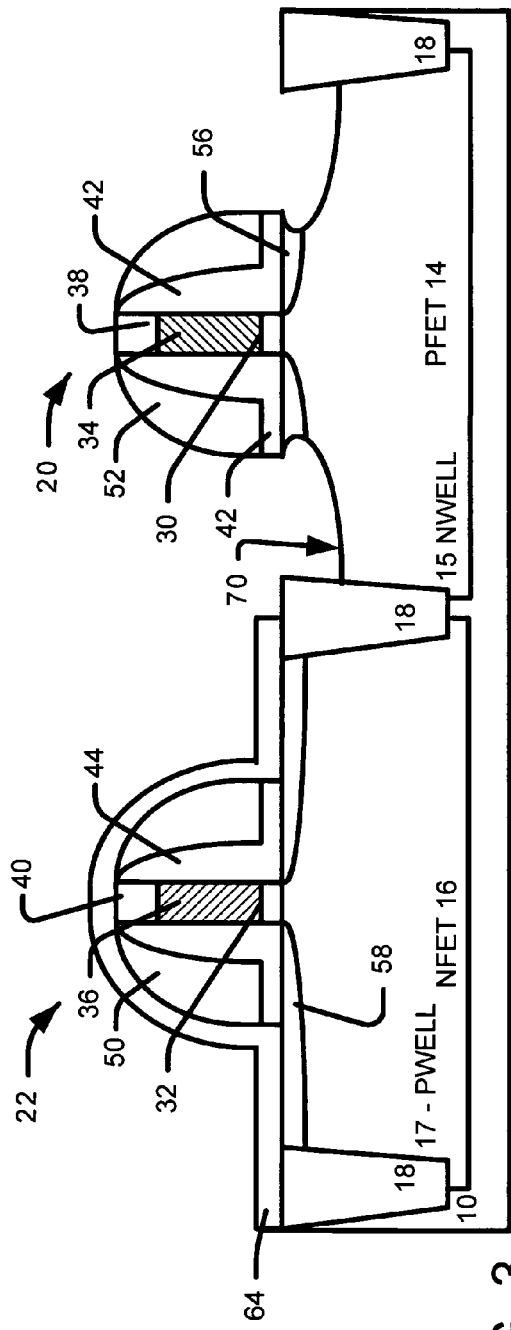

FIGS. 2 and 3 show an example process for forming the recesses 70.

Referring to FIG. 2 we form a dielectric layer 64 over the substrate surface. The dielectric layer is preferably conformal in nature and comprised of a low temperature oxide layer. The thickness of the dielectric layer 64 can be between 80 to 350 Angstroms.

The dielectric layer will be used as an etch mask for the subsequent S/D recess etch.

We form a first NFET mask 68 over the dielectric layer 64 in the NFET region 16.

We remove the dielectric layer 64 from over the PFET region using the first NFET mask 68 as an etch mask. A wet etch process is preferred; the wet etch can be comprised of a buffered HF etch.

As shown in FIG. 3, we remove the first NFET mask 68.

Referring to FIG. 3, we form recesses 70 in the PFET region 14 in the substrate 10 adjacent to the PFET second spacers 52 using a RIE process. The RIE can be comprised of an isotropic or anisotropic etch, or a combination of both. A typical isotropic dry etch process is carried out in a plasma etching chamber using a gas chemistry comprising $Cl_2$, He and/or $SF_6$, and process conditions that favor isotropic (or lateral) etch. In addition, the etch chemistry is chosen such that it is highly selective to the materials surrounding the gate structures 22 and 20. In this way, the oxide and nitride spacers surrounding the gate structures 22 and 20 are not etched or are etched to a minimum extent.

The recesses 70 preferably have a depth between 30 and 150 nm.

C. Form an PFET Embedded Source/drain Stressor

Figure 4:
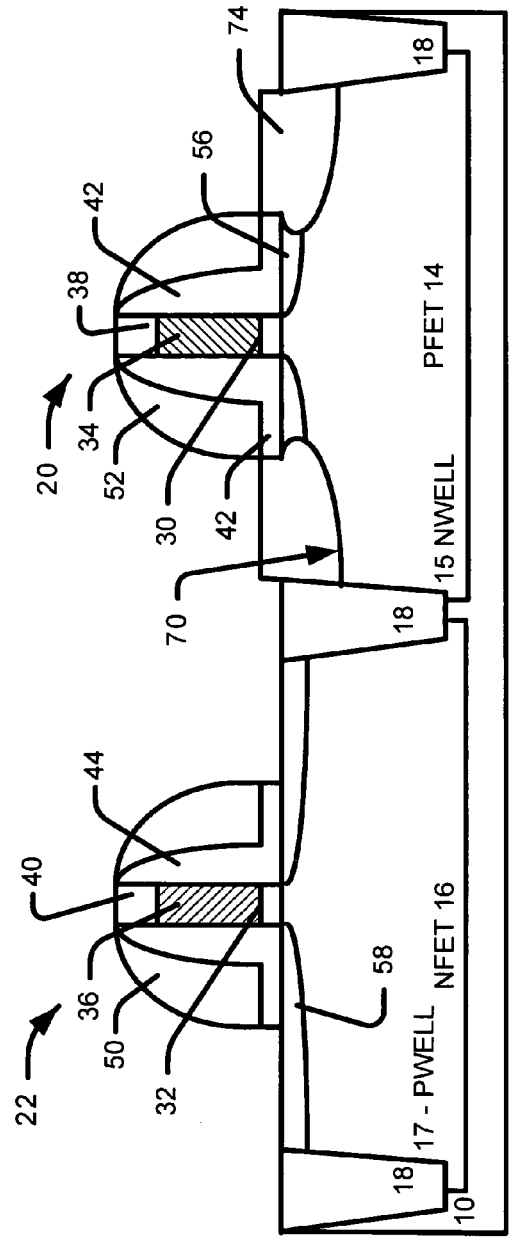

Referring to FIG. 4, we preferably perform an epitaxy pre-clean of the recess surface. The epitaxy pre-clean preferably is comprised of HF, either in the gaseous or liquid state, or a combination of steps and chemicals that include the gaseous HF or liquid HF.

We selectively form a PFET embedded (e.g., B doped SiGe) stressor in the source/drain region 74. The silicon-germanium alloy forms a lattice-mismatched region with the adjacent Si substrate 70, and this causes strain to be imparted in the channel direction. The lattice-mismatched region is formed using an epitaxial growth process such as chemical vapor deposition, ultra-high vacuum chemical vapor deposition, or molecular beam epitaxy. The epitaxy process is selective because SiGe only grows on exposed Si regions and not on the oxide or nitride protected gate. The SiGe stressor is preferably in-situ doped with B. In the present embodiment, the Ge concentration in the SiGe alloy is between 10 and 40 atomic percent. The boron concentration in the SiGe alloy is between $8E19/cm3$ to $1E21/cm3$.

Alternately, we can first grow undoped SiGe, followed by ion implantation and anneal to activate the dopants (e.g., B).

The PFET embedded Source/drain stressor 74 is formed to put a stress on the PFET channel region to improve device performance. The dielectric layer 64 over the NFET region 16 protects the NFET from SiGe epitaxial growth. If the dielectric layer 64 over the gate structures is not adequate to protect the NFET gate 36, for example, it may be thinned down or removed during the epitaxial preclean step, the NFET gate cap layer 40 prevents SiGe epitaxial growth in the NFET gate 36. The PFET gate cap layer 38 and PFET first spacers 42 protect the poly-Si gate 34 from SiGe epitaxial growth.

Referring to FIG. 4, we perform a dielectric (e.g., oxide) etch to remove the first dielectric layer 64 over the NFET region 16.

D. Form a NFET S/D Epitaxial Si Layer and a PFET S/D Epitaxial Si Layer

Figure 5:
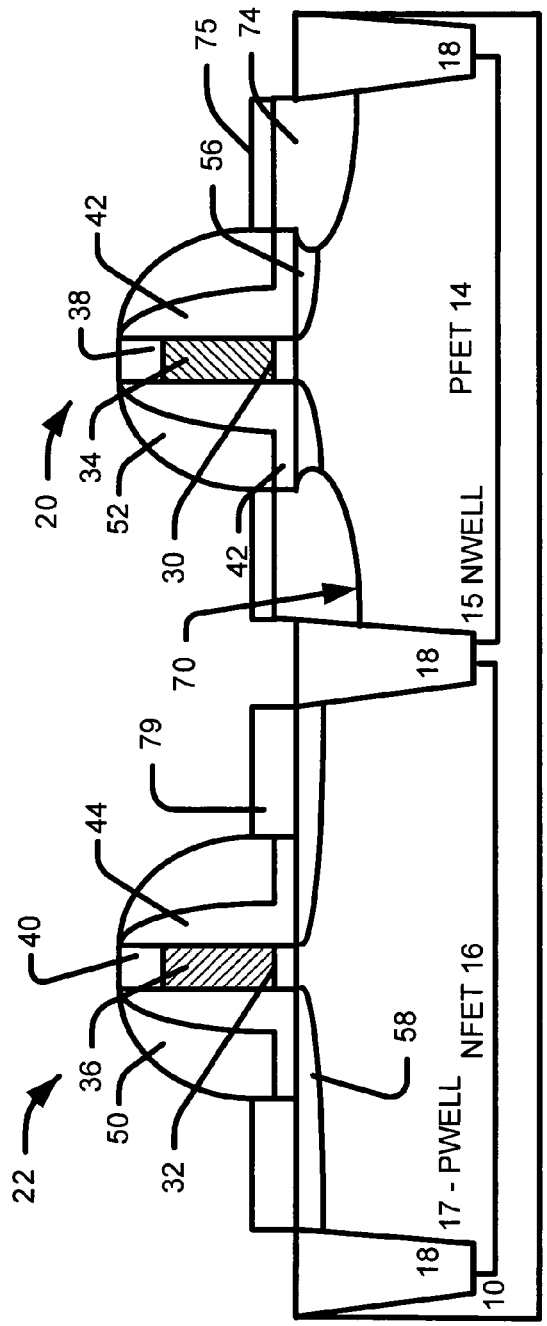

Referring to FIG. 5, we form a NFET S/D epitaxial Si layer 79 over the NFET SDE regions 58 and a PFET S/D epitaxial Si layer 75 over PFET embedded (B doped SiGe) source/drain stressor 74.

The NFET S/D epitaxial Si layer 79 can be thicker than that of PFET S/D epitaxial Si layer 75 because the epitaxial Si grows faster over the Si substrate than over the embedded (SiGe) S/D 74. The reason is that when Si grows over a Si surface, homo-epitaxy occurs, as opposed to Si growing over a SiGe surface (hetero-epitaxy occurs). The growth rate can also be controlled by the epitaxy process conditions.

The NFET gate cap layer 40 and PFET gate cap layer 38 protects the poly-Si gate from the Si epitaxial growth.

For example the epitaxial Si grows between 5% and 20% thicker over the Si Substrate than over the SiGe S/D 74. For example, the NFET S/D epitaxial Si layer 79 has a thickness between 50 and 500 angstroms and the PFET S/D epitaxial Si layer 75 can have a thickness between 40 and 400 angstroms.

It is a benefit that the NFET S/D epitaxial Si layer 79 is thicker than that PFET S/D epitaxial Si layer 75 (e.g., between 5% and 20% thicker). This is because typically, when we grow SiGe stressor 74, there will be an overgrowth above the substrate so that it forms a raised S/D structure. At this point the NFET surface is still not raised. By being able to grow a thicker Si layer 79 in the NFET, the final structure is such that both NFET and PFET has the almost the same level of raised S/D structure. This provides a greater process margin for the subsequent contact opening/RIE step.

Part of the NFET S/D epitaxial Si layer 79 and more preferably the entire PFET S/D epitaxial Si layer 75 will be consumed in a subsequent salicide step. The NFET S/D epitaxial Si layer 79 and PFET S/D epitaxial Si layer 75 reduce or prevent the NFET S/D and the PFET S/D junctions from being thinned and consumed in the subsequent salicide process.

The NFET S/D epitaxial Si layer 79 and PFET S/D epitaxial Si layer 75 help to create the raised S/D structures, thus reducing the external resistance and S/D sheet resistance, which in turn will improve device performance of both NFET and PFET. The PFET S/D epitaxial Si layer 75 is doped by outdiffusing of B from the embedded S/D stressor region 74 during a subsequent anneal.

Since the PFET S/D epitaxial Si layer (Si cap layer) 75 over the embedded Source/drain stressor 74 will be consumed in a subsequent salicide step, it acts as a sacrificial layer for the PFET embedded Source/drain stressor 74 to form a stable and low resistivity silicide. This is because SiGe alone usually does not form a low resistivity silicide with the typical metallic materials (e.g. Co, Ti, Ni or NiPt), and/or the suicide formed has poor surface and interface roughness. This is an advantage of the Si cap 75 over PFET embedded stressor Source/drain 74.

E. Remove the PFET Cap and the NFET Cap and Create the (Reduced) Second Spacers

There are at least two options for forming the reduced sized second spacers.

In a first option, we can remove PFET and NFET caps 38 and 40 and remove the second PFET spacers 52 and the second NFET spacers 50. Then we can reform the (reduced) second spacers.

Figure 6:
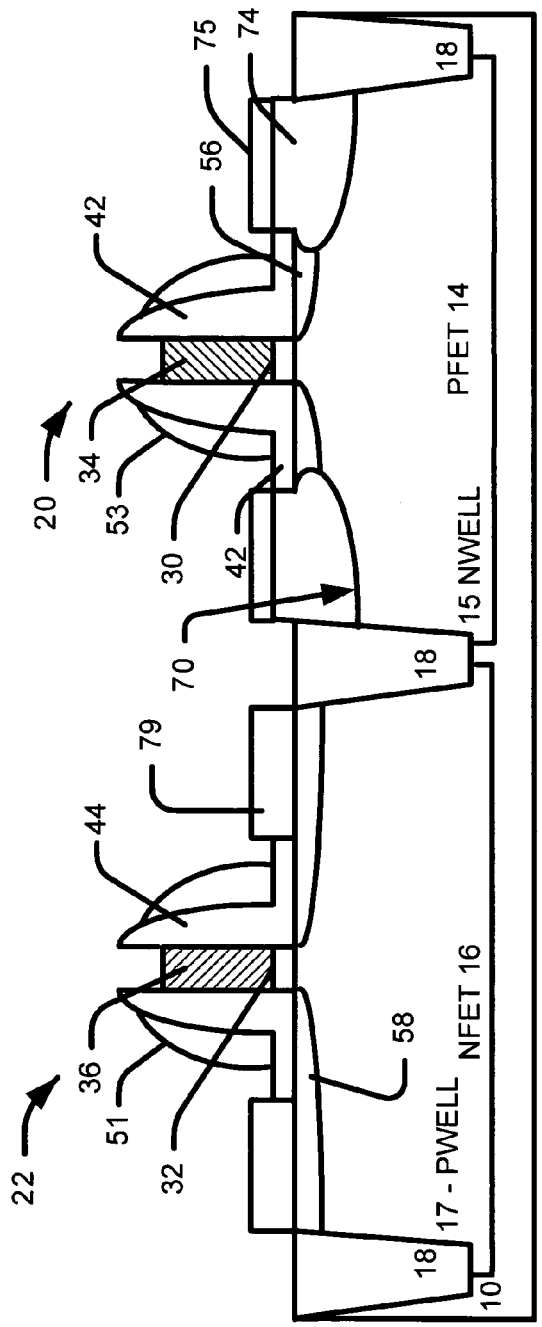

Referring to FIG. 6, we etch and remove the PFET cap 38 and the NFET cap 40 and remove the second PFET spacers 52 and the second NFET spacer 50. The etch is preferably a nitride wet etch. The wet etch can be comprised of a hot phosphoric acid etch. Preferably the second PFET spacers 52 and the second NFET spacer 50 are completely removed.

Then, we form reduced second PFET spacers 53 and reduced second NFET spacer 51. The reduced second PFET spacers 53 and reduced second NFET spacer 51 are preferably comprised of nitride.

The spacer are called reduced because the have a reduce height and width compared to the original second spacer. This is an advantage because the reduced spacers allow the stress from a subsequently formed overlying stress liner to be transmitted to the channel. The second reduced spacers can be 30 to 70% smaller in terms of height and/or width compared to the original second spacer.

In a second option, we can etch and remove PFET and NFET caps 38 and 40 and remove only a top portion of the second PFET spacers 52 and the second NFET spacers 50 to create the (reduced) second spacers 51 53.

F. Form the NFET Source/drains

Figure 7:
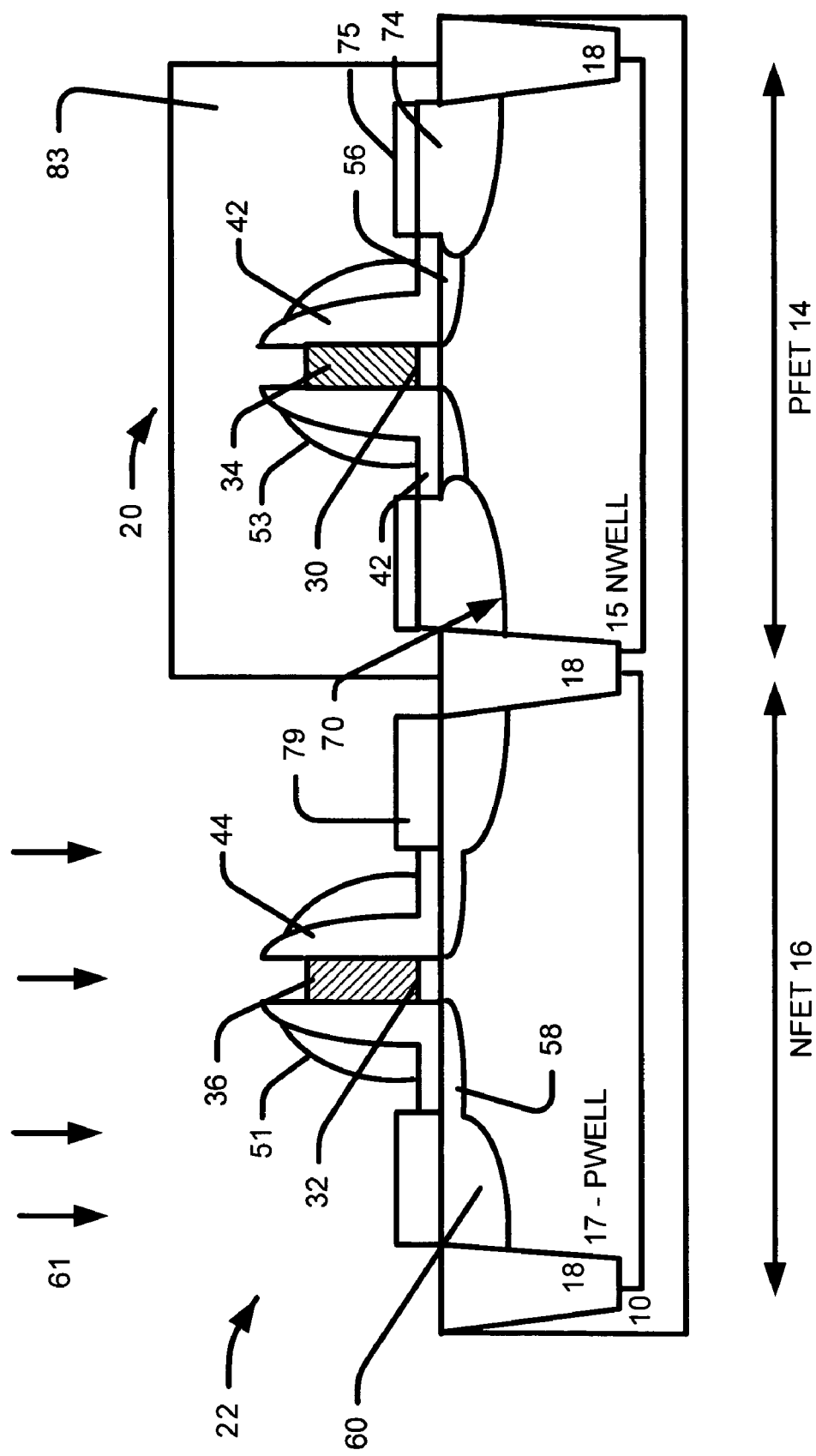

Referring to FIG. 7, we form a PFET mask 83 over the PFET region 14.

Still referring to FIG. 7, we implant 61 N-type ions into NFET region to form the NFET Source/drains 60.

Figure 8:
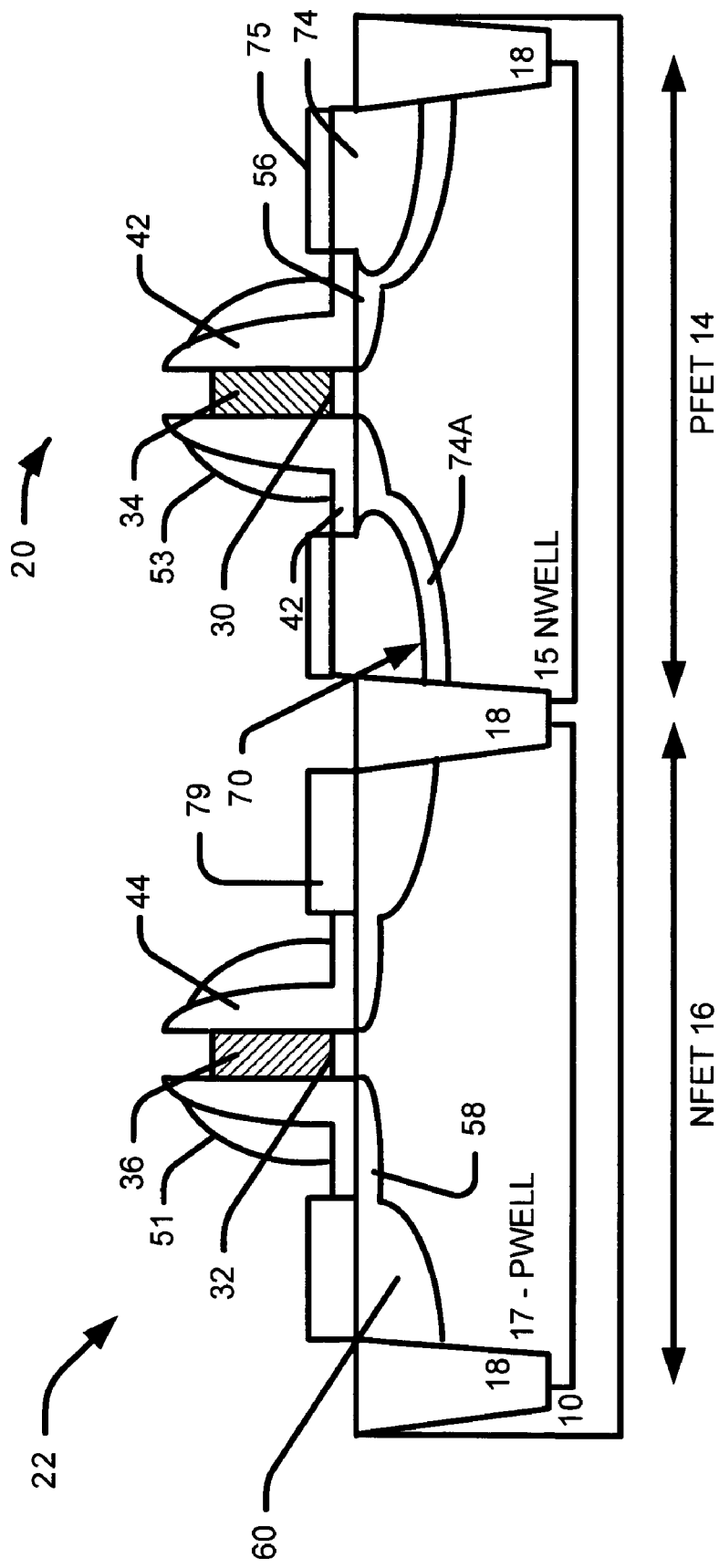

Next, as shown in FIG. 8, we remove the PFET mask 83.

G. Perform an Anneal to Form Final Junctions

We then perform an anneal to form final junctions.

The PFET S/D epitaxial Si layer 75 is doped by the outdiffusion of impurities (boron) from the embedded S/D 74.

The anneal is preferably performed at a temperature between 900 C. and 1350 C. for a time between 10 microsec and 5 sec. The anneal is preferably a spike anneal.

The P-type dopant from the embedded S/D 74 diffuses down into the substrate to form final PFET S/D junctions 74A.

H. Silicide Process

Figure 9:
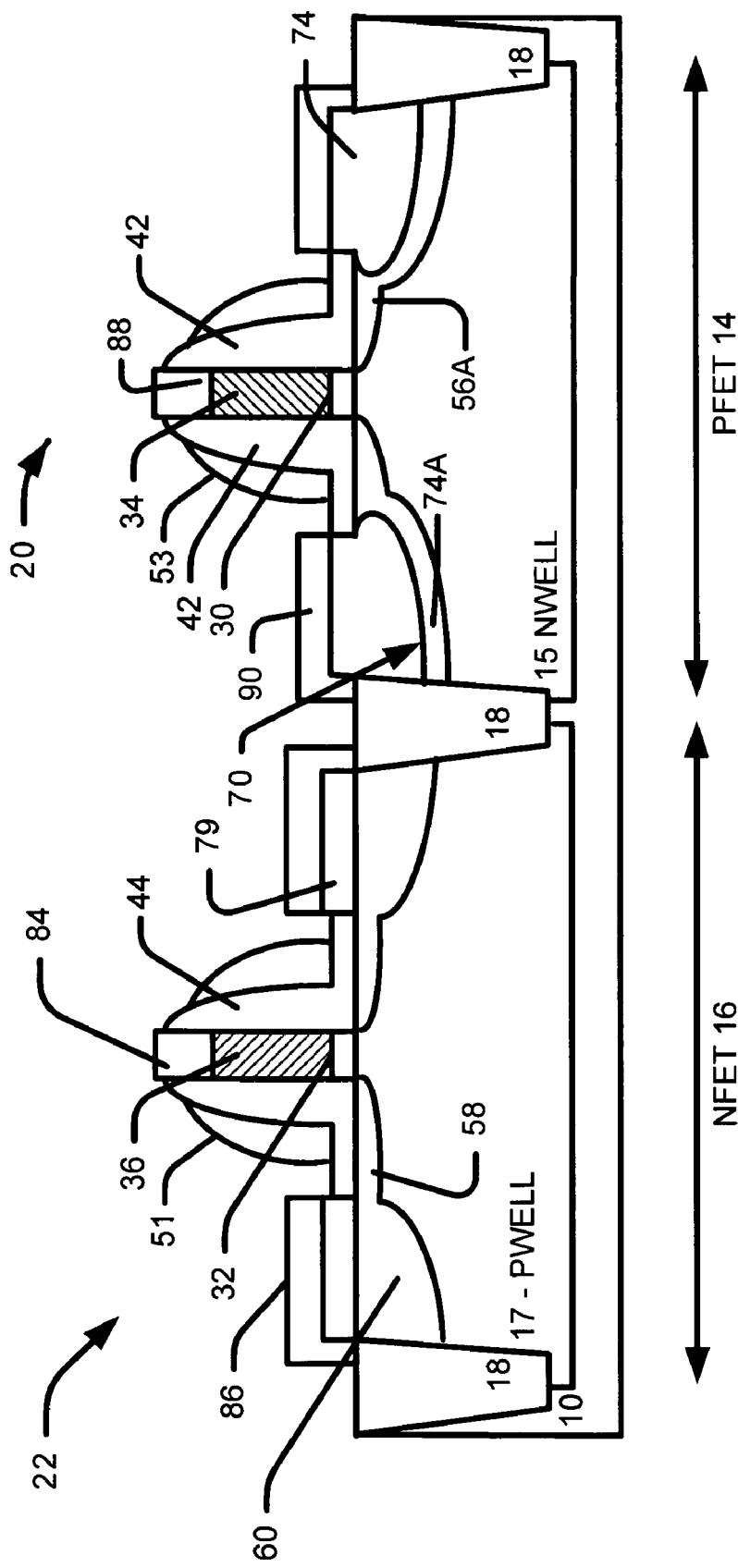

As shown in FIG. 9, silicide can be formed over the gates and source/drain regions. On the NFET, gate silicide layer 84 and raised S/D silicide layer 86 are formed over NFET gate 36 and NFET raised S/D 60 79. On the PFET region 14, gate silicide layer 88 and S/D silicide layer 90 is formed over PFET gate 34 and stressor regions 74 (and Si epitaxial layer 75 if not totally consumed by the silicide process).

To form silicide, we first deposit a metal layer such as essentially Ni, Pt, NiPt, NiPd or Co, or combinations thereof and most preferably NiPt over the substrate surface, the NFET region 16 and the PFET region 14. Then, we anneal the substrate 10 to convert the metal to metal-silicides. We remove the unreacted metal layer with a selective metal etch process (preferably wet etch). After this step, an optional heat treatment is performed to form metal-silicides of desired silicide phases with low sheet resistance values.

I. Further Processing

Figure 10:
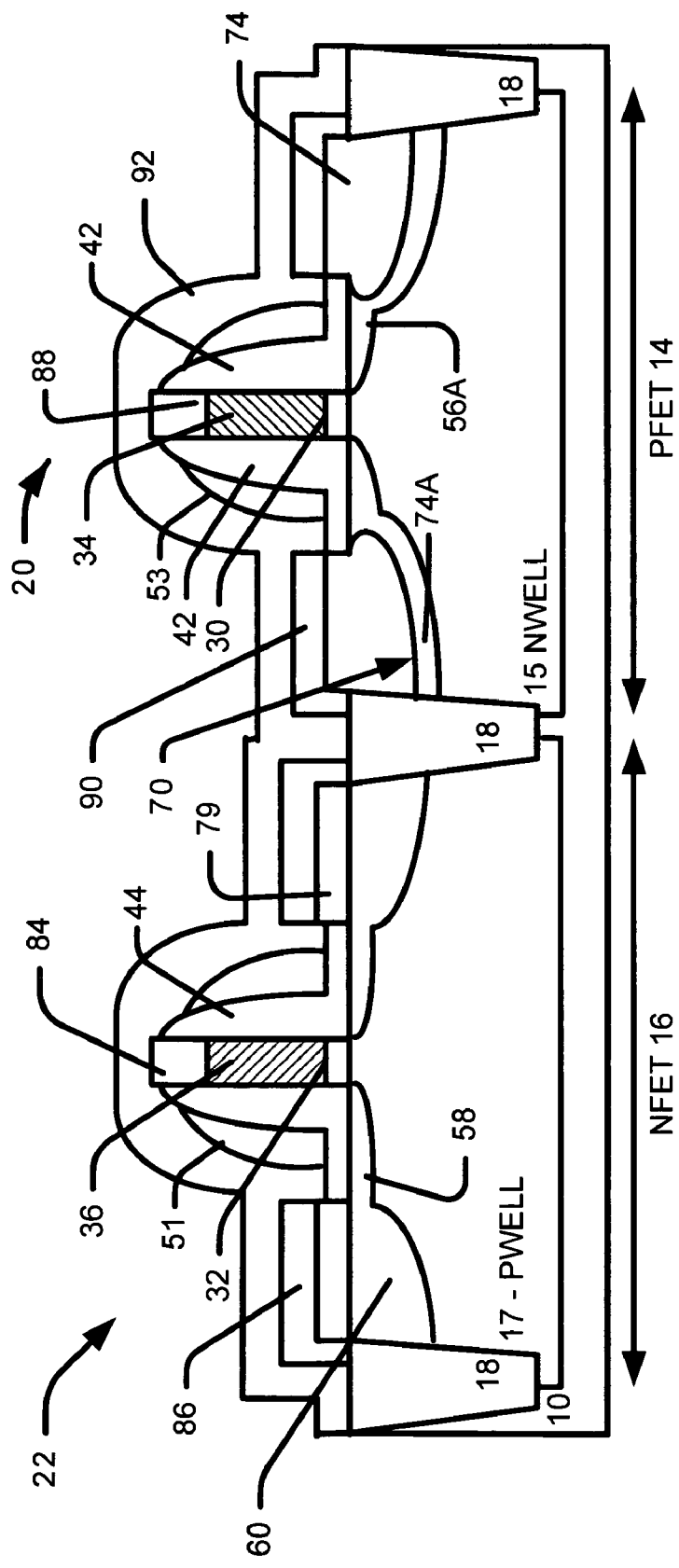

Subsequent processing can continue, (see FIG. 10) such as the formation: of a stress liner (e.g., SiN) 92 over the substrate and FET devices. The stress liner can create a compressive stress on the PFET channel. The reduced width PFET spacers 53 on the PFET gate can increase the compressive stress to the PFET channel.

Also, we can form an interlevel dielectric layer, contacts, and overlying dielectric layers and interconnects.

J. Non-limiting Example Embodiments

In the above description the order of the steps can be changed. In the above description numerous specific details are set forth such as flow rates, pressure settings, thicknesses, etc., in order to provide a more thorough understanding of the present invention. Those skilled in the art will realize that power settings, residence times, gas flow rates are equipment specific and will vary from one brand of equipment to another.

It will be obvious, however, to one skilled in the art that the present invention may be practiced without these details. In other instances, well known process have not been described in detail in order to not unnecessarily obscure the present invention.

Although this invention has been described relative to specific insulating materials, conductive materials and apparatuses for depositing and etching these materials, it is not limited to the specific materials or apparatuses but only to their specific characteristics, such as conformal and nonconformal, and capabilities, such as depositing and etching, and other materials and apparatus can be substituted as is well understood by those skilled in the microelectronics arts after appreciating the present invention Given the variety of embodiments of the present invention just described, the above description and illustrations show not be taken as limiting the scope of the present invention defined by the claims.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method for forming a semiconductor device comprising the steps of:
    providing a N-doped field effect transistor (NFET) gate structure over a NFET region in a substrate and a P-doped field effect transistor (PFET) gate structure over a PFET region, wherein a gate structure comprises first and second spacers on sidewalls and a cap layer;
    providing NFET source drain extension (SDE) regions adjacent to said NFET gate; and providing PFET SDE regions adjacent to said PFET gate;
    forming recesses in said PFET region in the substrate adjacent to said PFET second spacers;
    forming a PFET embedded Source/drain stressor in the recesses;
    forming a NFET source drain (S/D) epitaxial Si layer over the NFET SDE regions and a PFET S/D epitaxial Si layer over PFET embedded source/drain stressor, wherein the NFET S/D epitaxial layer comprises a faster growth rate than the PFET S/D epitaxial Si layer;
    removing the cap layer on the PFET and NFET gate structures and reducing second spacers of the gate structures to form reduced second PFET spacers and reduced second NFET spacers; and
    performing a NFET S/D implant by implanting N-type ions into NFET region adjacent to the NFET gate structure and into the NFET S/D epitaxial Si layer to form the raised NFET source/drains.

2. A method for forming a semiconductor device comprising the steps of:
    a) proving NFET gate structure over a NFET region in a substrate and PFET gate structure over a PFET region;
        (1) said NFET gate structure is comprised of a NFET gate dielectric, a NFET gate, NFET gate cap, NFET first spacers, NFET second spacers;
        (2) said PFET gate structure is comprised of a PFET gate dielectric, a PFET gate, PFET gate cap, PFET first spacers, and PFET second spacers;
    b) providing NFET SDE regions adjacent to said NFET gate; and providing PFET SDE regions adjacent to said PFET gate;
    c) forming recesses in said PFET region in the substrate adjacent to said PFET second spacers;
    d) forming a PFET embedded Source/drain stressor using an in-situ Boron doped SiGe epitaxy process;
    e) forming a NFET S/D epitaxial Si layer over the NFET SDE regions and a PFET S/D epitaxial Si layer over PFET embedded source/drain stressor;
        (1) the NFET S/D epitaxial Si layer is thicker than the PFET S/D epitaxial Si layer;
    f) etching and removing the PFET gate cap and the NFET gate cap and removing said second PFET spacers and said second NFET spacer
    g) forming reduced second PFET spacers and reduced second NFET spacers;
    h) performing a NFET S/D implant by implanting N-type ions into NFET region adjacent to the NFET gate structure and into the NFET S/D epitaxial Si layer to form the NFET raised Source/drains;
    i) forming silicide regions over the NFET raised source/drain regions and the PFET embedded source/drain stressor.

3. The method of claim 2 which further includes: forming a stressor layer over the substrate and NFET gate structure and PFET gate structure.

4. A method for forming a semiconductor device comprising:
    providing a substrate having first and second active regions, wherein the first and second active regions are prepared with first and second transistor gate structures of first and second transistors, wherein a gate structure comprises first and second spacers and a cap layer;
    forming recesses in the second active region adjacent to the second transistor gate structure;
    filling the recesses with a fill layer;
    forming first source/drain (s/d) layers in the first active region adjacent to the first gate structure and second s/d layers over the recesses in the second active region, wherein the first s/d layers comprise a faster growth rate than the second s/d layers; and
    removing caps over the first and second gate structures and reducing second sidewall spacers on the first and second gate structures.

5. The method of claim 4 wherein the first transistor comprises a n-type transistor and the second transistor comprises a p-type transistor.

6. The method of claim 4 wherein the fill layer comprises a SiGe layer and the s/d layers comprise a Si layer.

7. The method of claim 4 comprises implanting first type ions into the first active region, wherein the first type ions comprise n-type ions.

8. The method of claim 4 wherein the fill layer comprises a SiGe layer doped with second type ions.

9. The method of claim 8 wherein the fill layer is formed using an in-situ epitaxy process.

10. The method of claim 8 wherein the second type ions comprise p-type ions.

11. The method of claim 4 further includes forming a stressor layer over the substrate and first and second transistor gate structures.

12. A method for forming a semiconductor device comprising:
    providing a substrate having first and second active regions, wherein the first and second active regions are prepared with first and second transistor gate structures of first and second transistors, wherein the first and second gate structures include caps over the gate structures and first and second sidewall spacers on sidewalls of the gate structures;

forming stressors in the second active region adjacent to the second transistor gate structure; and forming first s/d layers on the substrate in the first active region adjacent the first gate structure and second s/d layers on the stressors in the second active region, wherein the first s/d layers comprise a faster growth rate than the second s/d layers;

removing caps over the first and second gate structures; and reducing the second sidewall spacers on the first and second gate structures.

13. The method of claim 12 wherein the first transistor comprises n-type transistor and the second transistor comprises a p-type transistor.

14. The method of claim 13 wherein:
the stressors comprise a top surface above the substrate; and
the first and second s/d layers form first and second raised s/d structures of the first and second transistors, the first and second raised s/d structures having top surfaces which are about coplanar.

15. The method of claim 12 wherein the stressors comprise a top surface above the substrate.

16. The method of claim 12 wherein first and second s/d layers form first and second raised s/d structures of the first and second transistors, the first and second raised s/d structures having top surfaces which are about coplanar.

17. The method of claim 12 comprises implanting first type ions into the first s/d layer over the first active region to form raised diffusion structures.

18. The method of claim 12 wherein the stressors comprises SiGe doped with ions of a second type.

19. The method of claim 18 wherein the second type ions comprises p-type.

20. The method of claim 12 wherein forming stressors comprises:
recessing the substrate in the second active region adjacent to the second gate structure; and
filling the recess with stress inducing material.

21. The method of claim 12 wherein the stressors comprises SiGe doped with ions of a second type and the first and second s/d layers comprise Si.

22. The method of claim 12 wherein forming stressors comprises:
recessing the substrate in the second active region adjacent to the second gate structure using a selective isotropic etch to form recesses with undercut under the second gate structure; and
filling the recess with stress inducing material.

* * * * *